United States Patent
Saeki (10) Patent No.: US 6,396,318 B2
(45) Date of Patent: May 28, 2002

(54) CLOCK PERIOD SENSING CIRCUIT

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/901,062

(22) Filed: Jul. 10, 2001

Related U.S. Application Data (62) Division of application No. 09/511,772, filed on Feb. 24, 2000.

(51) Int. Cl.$^7$ ............................................... H03B 19/00
(52) U.S. Cl. ........................ 327/116; 327/113; 327/119
(58) Field of Search ................................. 327/113, 114, 327/116, 119, 163, 165

(56) References Cited

U.S. PATENT DOCUMENTS

| | | | |
|---|---|---|---|
| 5,128,624 A | * 7/1992 | Hoshino et al. | 328/133 |
| 5,179,438 A | * 1/1993 | Morimoto | 358/17 |
| 6,218,896 B1 | * 4/2001 | Hongbin Hao et al. | 327/12 |
| 6,247,138 B1 | * 6/2001 | Tamura et al. | 713/600 |

FOREIGN PATENT DOCUMENTS

| | | |
|---|---|---|
| JP | 11-4145 | 1/1999 |
| JP | 11-4146 | 1/1999 |
| WO | 97/42707 A1 | 11/1997 |

* cited by examiner

*Primary Examiner*—Tuan T. Lam
*Assistant Examiner*—Hiep Nguyen
(74) *Attorney, Agent, or Firm*—Sughrue Mion, PLLC (57) ABSTRACT

Disclosed is a clock period sensing circuit in which it is possible to broaden the operating range of phase adjustment and frequency multiplier circuits, etc., by performing coarse period adjustment in advance. A plurality of delay sensing circuits having slightly overlapping operating ranges and different centers of operation are connected in parallel with respect to a an input clock signal, which is passed through the delay sensing circuits. The period of the clock is sensed coarsely in short periods using a signal which identifies delay sensing circuits through which the clock signal has passed and delay sensing circuits through which the clock signal has not passed.

6 Claims, 10 Drawing Sheets

CLOCK PERIOD SENSING CIRCUIT

This is a divisional of U.S. patent application Ser. No. 09/511,772 (Confirmation Number not yet assigned) filed Feb. 24, 2000, the disclosure of which is incorporated herein by reference.

FIELD OF THE INVENTION

This invention relates to a clock period sensing circuit and, more particularly, to a clock delay sensing circuit capable of sensing delay and finely adjusting the same.

BACKGROUND OF THE INVENTION

Figure 10:
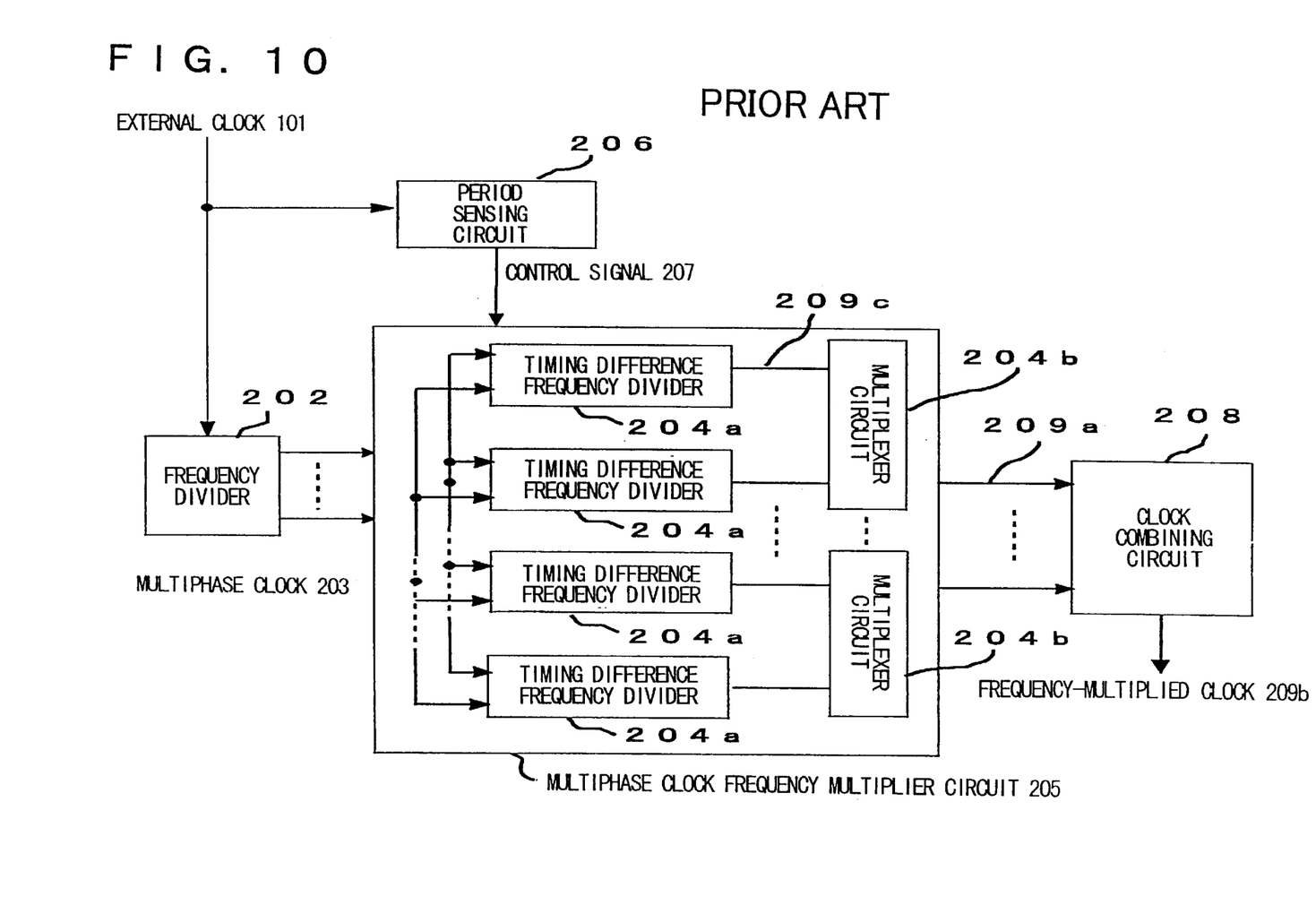
FIG. 10 is a block diagram illustrating the construction of a clock frequency multiplier circuit according to the prior art.

Examples of conventional clock delay sensing circuits include a series of sensing circuits comprising a series of inverters, and means for sensing delay from the number of stages of a ring oscillator. For example, as shown in FIG. 10, there is known an arrangement in which a period sensing circuit 206 comprises a ring oscillator of a fixed number of stages and a counter, in which the oscillation frequency of the ring oscillator in the period of an input clock is counted by the counter to sense the clock period.

Figure 11:
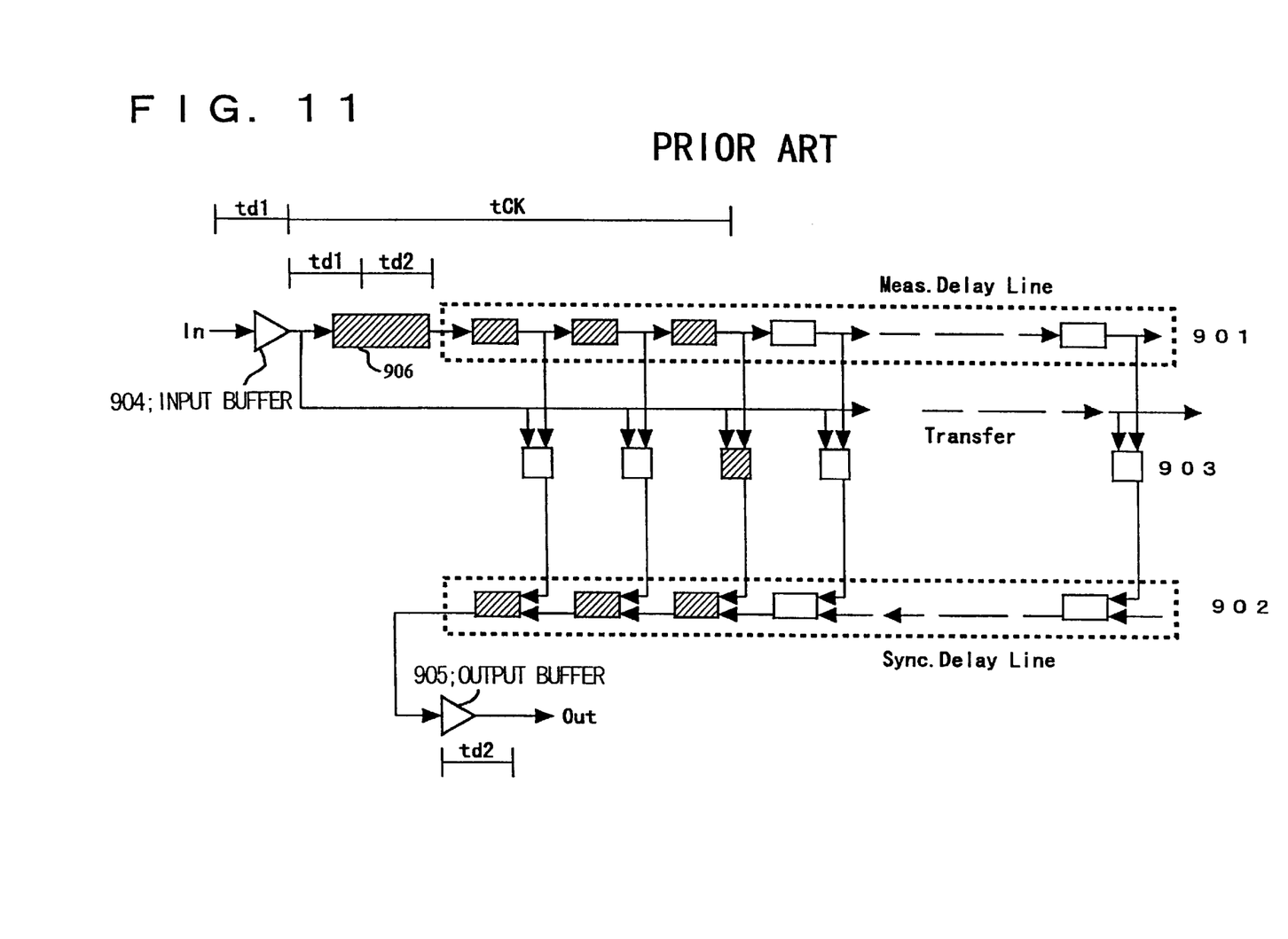
FIG. 11 is a diagram illustrating the construction of a synchronous delay circuit according to the prior art.

Further, FIG. 11 illustrates an example of the construction of a synchronous delay circuit according to the prior art. This circuit has as its basic components a first delay circuit line 901 for measuring delay ("measuring delay line") and a second delay circuit line 902 for reconstructing delay ("synchronizing delay line"), the direction of signal propagation of the latter being the opposite of the former. The output end of the second delay circuit line 902 is connected to an output buffer (having a delay time td2), and a transfer control circuit 903 is provided between the first delay circuit line 901 and second delay circuit line 902. The transfer control circuit 903 turns on upon receiving an output from an input buffer 904. A dummy delay circuit 906 having a delay time td1+td2 is inserted between an output end of the input buffer 904 and an input end of the first delay circuit line 901.

An input clock signal enters the first delay circuit line 901 from the input buffer 904 and propagates through the first delay circuit line 901 by the time the next pulse enters following the clock signal period (tCK). At the moment the next pulse enters, the transfer control circuit 903 turns on so that a pulse that has propagated through the first delay circuit line 901 over a period of time equal to (tCK−td1−td2) enters the second delay circuit line 902 from this position, propagates through and is output from the second delay circuit line 902 over the time period (tCK−td1−td2) of propagation through the first delay circuit line 901. The pulse is output via an output buffer 905 (whose delay time is td2). Thus, a signal delayed by 2tCK from the input In is output at an output terminal Out, where [input buffer (td1)]+[delay circuit (td1+td2)]+{first and second delay circuits [2×(tCK−td1−td2)]}+[output buffer (td2)]=2tCK.

SUMMARY OF THE DISCLOSURE

In this arrangement of the conventional delay sensing circuit comprising a series of inverters in which the inverter is a unit delay circuit, the unit of delay is decided by the propagation delay time of one inverter stage. Consequently, if the clock period in a subsequent stage is to be finely adjusted, it is required that the unit of delay used in coarse adjustment be changed over at the ends of the operating range. The reason for this is that there is no overlapping of operating ranges in terms of the individual units of delay.

Accordingly, it is an object of the present invention to provide a clock period sensing circuit in which it is possible to broaden the operating range of phase adjustment and frequency multiplier circuits, etc. It is another object of the present invention to provide a clock period sensing circuit in which it is possible to broaden the operating range of phase adjustment and frequency multiplier circuits, etc., particularly allowing performing coarse period adjustment in advance.

According to a first aspect of the present invention, the foregoing object is attained by providing a clock period sensing circuit comprising: a plurality of parallel connected delay sensing circuits having slightly overlapping operating ranges and different centers of operation, wherein a clock signal is passed through the plurality of delay sensing circuits, and the period of the clock is sensed using a signal which identifies delay sensing circuits through which the clock signal has passed and delay sensing circuits through which the clock signal has not passed.

According to a second aspect of the present invention, there is provided a clock period sensing circuit comprising: a plurality of delay circuits to which a clock signal is applied as a common input and which are arranged in parallel and have delay times that differ from one another; a plurality of latch circuits to which outputs of respective ones of the delay circuits are input for latching the clock signal as a latch timing signal; and a plurality of encoder circuits to which the outputs of the latch circuits are input for encoding information representing a boundary between delay circuits traversed by the clock signal and delay circuits not traversed by the clock signal, and outputting the encoded information as a control signal.

According to a third aspect of the present invention, the clock period sensing circuit is characterized in that the plurality of delay circuits have operating ranges that overlap each other slightly and centers of operation that differ from one another.

According to a fourth aspect of the present invention, the clock period sensing circuit is characterized in that each of the delay circuits has:

a P-type transistor which is connected between a power supply and an internal node and to which a signal obtained by inverting an input signal is applied as a gate input; and an N-type transistor, which is driven by a constant-current source, connected between the internal node and ground and to which the signal obtained by inverting the input signal is applied as a gate input;

a plurality of serially connected switches and capacitors being connected in parallel between the internal node and ground, and delay time being decided by deciding a capacitance applied to the internal node by a capacitance control signal connected to a control terminal of each switch;

the delay circuit having an inverter for inverting and outputting a potential present at the internal node.

According to a fifth aspect of the present invention, there is provided a timing dividing circuit (interpolator) comprising:

first, second and third timing dividing circuit (interpolator)s connected in parallel and each having a P-type transistor which is connected between a power supply and an internal node and to which a signal obtained by taking NAND between first and second input signals is applied as a gate input, and first and second N-type transistors, which are driven by a constant-current source, connected between the internal node and ground and to which signals obtained by inverting the first and second input signals are applied as gate inputs; a plurality of serially connected switches and capacitors being connected in parallel between the internal node and ground, and delay time being decided by deciding a capacitance applied to the internal node by a capacitance control signal connected to a control terminal of each switch; each timing dividing circuit (interpolator) having an inverter for inverting and outputting a potential present at the internal node;

wherein a first clock of two clocks having different phases is supplied commonly as the first and second input signals to the first timing dividing circuit (interpolator);

first and second clocks constituting the two clocks having the different phases are supplied as the first and second input signals to the second timing dividing circuit (interpolator); and a second clock of the two clocks having the different phases is supplied commonly as the first and second input signals to the third timing dividing circuit (interpolator);

the capacitance of the timing dividing circuit (interpolator) being selected by the control signal from the clock period sensing circuit according to any one of the first to fourth aspects.

According to a sixth aspect of the present invention, the timing dividing circuit (interpolator) is characterized in that the capacitance is set in such a manner that ranges over which the timing dividing circuit (interpolator) outputs a timing which is one-half the difference between the timings of the first and second clock inputs overlap each other along a time axis.

According to a seventh aspect of the present invention, there is provided a clock frequency multiplier circuit for outputting a frequency-multiplied clock, comprising:

a frequency dividing circuit for frequency-dividing a clock signal, generating and outputting a multiphase clock;

a clock period sensing circuit to which the clock signal is input;

a plurality of timing dividing circuits (interpolators) for outputting timing signals obtaining by dividing differences between input timings of the multiphase clock; and multiplexer circuits for multiplexing outputs of the plurality of timing dividing circuits (interpolators);

wherein the clock period sensing circuit comprises the clock period sensing circuit according to any one of the first to fourth aspects.

According to an eighth aspect of the present invention, the clock frequency multiplier circuit is characterized in that each of the timing dividing circuits (interpolators) has:

a P-type transistor which is connected between a power supply and an internal node and to which a signal obtained by taking NAND between first and second input signals is applied as a gate input; and first and second N-type transistors, which are driven by a constant-current source, connected between the internal node and ground and to which signals obtained by inverting the first and second input signals are applied as gate inputs;

a plurality of serially connected switches and capacitors being connected in parallel between the internal node and ground, and amount of delay being decided by deciding a capacitance applied to the internal node by a capacitance control signal connected to a control terminal of each switch;

each timing dividing circuit (interpolator) having an inverter for inverting and outputting a potential present at the internal node;

the capacitance being decided by a control signal from the clock period sensing circuit.

According to a ninth aspect, in the circuit according to the second aspect, each of said delay circuits has:

a first-type transistor which is connected between a power supply and an internal node and to which a signal indicative of an input signal is applied as a gate input; and a second-type transistor, which is driven by a constant-current source, connected between said internal node and ground and to which the signal indicative of the input signal is applied as a gate input;

a plurality of serially connected switches and capacitors being connected in parallel between said internal node and ground, and delay time being decided by deciding a capacitance applied to said internal node by a capacitance control signal connected to a control terminal of each switch;

said delay circuit outputting an output signal indicative of a potential present at said internal node.

According to a tenth aspect, there is provided a timing dividing circuit (interpolator) comprising:

first, second and third timing dividing circuits (interpolators) connected in parallel and each having a first-type transistor which is connected between a power supply and an internal node and to which a signal obtained by taking logic between first and second input signals is applied as a gate input, and first and second-type transistors, which are driven by a constant-current source, connected between said internal node and ground and to which a signal obtained by inverting said signal obtained from the first and second input signals is applied as gate inputs; a plurality of serially connected switches and capacitors being connected in parallel between said internal node and ground, and delay time being decided by deciding a capacitance applied to said internal node by a capacitance control signal connected to a control terminal of each switch; each timing dividing circuit (interpolator) outputting an output signal indicative of a potential present at said internal node;

wherein a first clock of two clocks having different phases is supplied commonly as the first and second input signals to said first timing dividing circuit (interpolator);

first and second clocks constituting the two clocks having the different phases are supplied as the first and second input signals to said second timing dividing circuit (interpolator); and a second clock of the two clocks having the different phases is supplied commonly as the first and second input signals to said third timing dividing circuit (interpolator);

the capacitance of said timing dividing circuit (interpolator) being selected by the control signal from the clock period sensing circuit according to the first aspect.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

A mode for practicing the present invention will be described below.

Figure 1:
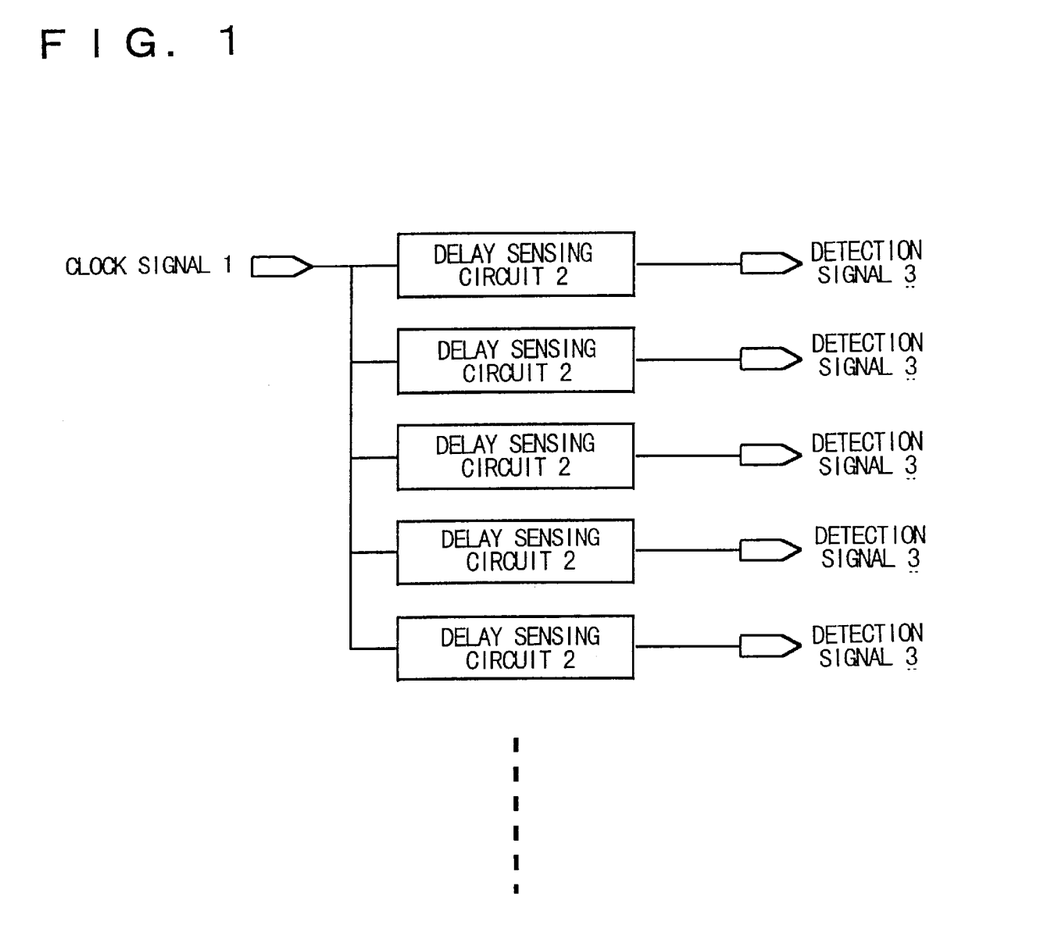
FIG. 1 is a diagram illustrating an arrangement for practicing the present invention.

FIG. 1 is a diagram illustrating an arrangement of a clock period sensing circuit for practicing the present invention. As shown in FIG. 1, a plurality of delay sensing circuits 2 having slightly different delay times are arranged in parallel with respect to an input clock signal 1, and the clock signal 1 is passed through a plurality of the delay sensing circuits 2. By identifying from outputs of detection signals 3 those delay sensing circuits that have and have not been traversed by the clock signal, the clock period can be sensed coarsely in short periods.

Figure 2:
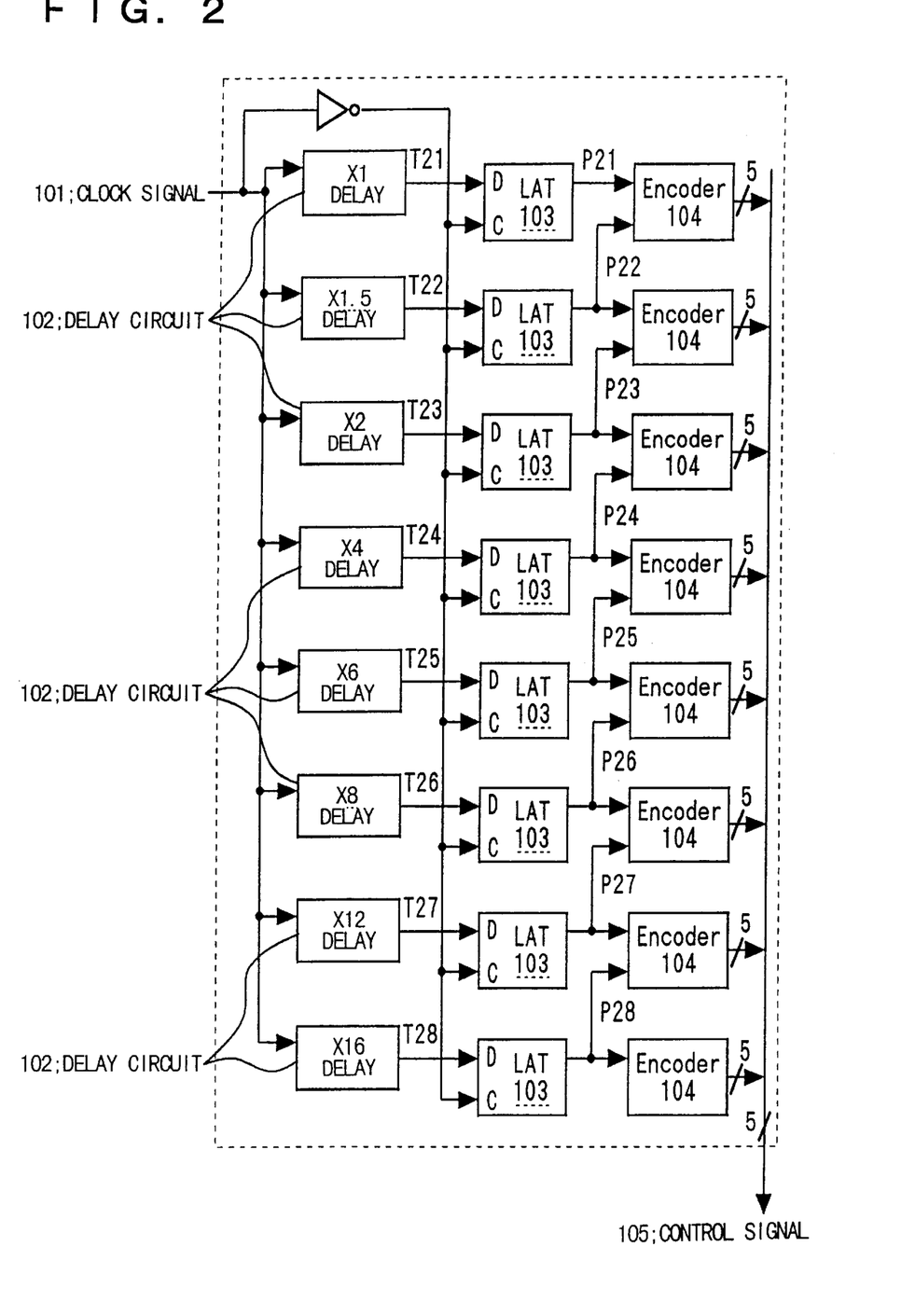
FIG. 2 is a block diagram showing an arrangement according to an embodiment of the present invention.

Further, in a preferred embodiment of the present invention, as shown in FIG. 2, a clock period sensing circuit comprises a plurality of delay circuits 103 to which a clock signal is input and which are arranged in parallel with delay times that differ from one another, a plurality of latch circuits 103 to which the outputs of respective ones of the delay circuits 103 are input for latching the clock signal as a latch timing signal, and encoder circuits 104 to which the outputs of the latch circuits 103 are input for detecting a boundary between delay circuits traversed by the clock signal and delay circuits not traversed by the clock signal, encoding the boundary as a control signal and outputting a control signal 105.

DETAILED DESCRIPTION OF THE EMBODIMENTS

An embodiment of the present invention will now be described in greater detail with reference to the drawings.

By way of example, in a circuit for adjusting the phase of a clock signal or for frequency multiplying the same using a timing dividing circuit (interpolator) which generates a timing obtained by internally dividing the difference between the input timings of two inputs [for example, see Japanese Patent Kokai Publication JP-A-11-4146 (Application No. 09-157042) and JP-A-11-4145 (Application No. 09-157028), the clock period that can be used is decided by capacitance, etc., connected to the output section of the timing dividing circuit (interpolator) (referred to as a "timing-difference dividing unit"). Conversely, the frequency range capable of being used by the circuit can be broadened by sensing the clock period and deciding the size of the capacitance, etc.

In order to sense a clock period in this embodiment of the present invention, there are provided a plurality of parallel-connected circuits in which the circuit constants have been decided in such a manner that the operating frequency range of each circuit is overlapped slightly by the operating frequency range of the next circuit, the clock period is sensed as a value such as the capacitance of a correctly (normally) operating circuit, and a fine adjustment is performed by a separate circuit disposed as a subsequent stage.

FIG. 2 is a block diagram illustrating the construction of this embodiment of the present invention. As shown in FIG. 2, the embodiment includes the latch circuits 103 and encoders 104 provided as the final stages of respective ones of the plurality of parallel delay circuits 102 having delay times that differ from one another.

Each latch circuit 103 has a data input terminal (D) to which the output of the corresponding of the delay circuit 102 is input and a clock input terminal (C) to which a signal obtained by inverting a clock signal 101 by an inverter is input. The latch circuit latches and outputs this signal.

The delay times of the plurality of delay circuits 102 are set to, e.g., X1, X1.5, X2, X4, X6, X8, X12 and X16. The clock signal 101 that has traversed a delay circuit 102 is latched in the corresponding latch circuit 103 at the rising edge of the signal obtained by inverting the clock signal 101. Information indicating the boundary between a group of latch circuits corresponding to delay circuits traversed by the clock signal and a group of latch circuits corresponding to delay circuits not traversed by the clock signal is output from the encoder circuit 104 as a control signal 105. With the exception of the encoder circuit 104 at the lower end, each encoder circuit 104 receives the outputs of two mutually adjacent latch circuits 103 as inputs and encodes the same.

Figure 3:
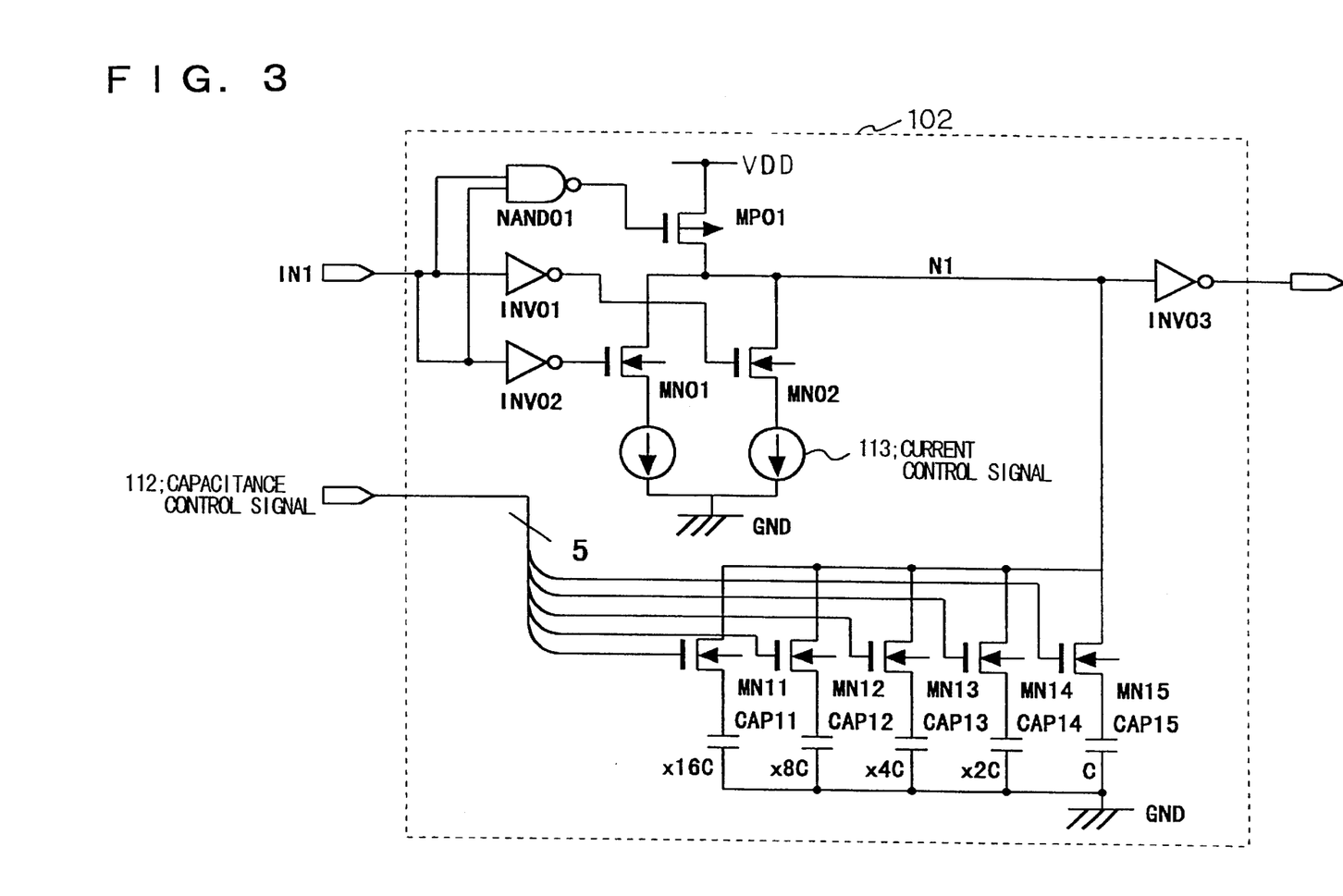
FIG. 3 is a diagram illustrating the construction of a delay circuit according to an embodiment of the present invention.

FIG. 3 is a diagram illustrating the construction of the delay circuit 102 according to this embodiment. As shown in FIG. 3, the delay circuit 102 has an external input IN1 connected to input terminals of a NAND gate NAND01 and inverters INV01, INV02. An output of the NAND gate NAND01 is connected to a gate electrode of a P-type MOS transistor MP01, an output of the inverter INV01 is connected to a gate electrode of an N-type MOS transistor MN02, and an output of the inverter INV02 is connected to a gate electrode of an N-type MOS transistor MN01.

The source electrode and drain electrode of the P-type MOS transistor MP01 are connected to a power supply VDD and internal node N1, respectively. The source electrodes of the N-type MOS transistors MN01 and MN02 are connected to ground GND via a constant-current source whose current value is capable of being varied by a constant-current control signal 113, and the drain currents of these transistors are connected the internal node N1. The internal node N1 is further connected to the input terminal of an inverter INV03 and to the drain electrodes of N-type MOS transistors MN11–15. The gate electrodes of the N-type MOS transistors MN11–15 are each connected to a capacitance control signal 112, and the source electrodes of these transistors are connected to one ends of respective ones of capacitors CAP11–15. The other ends of the capacitors CAP11–15 are connected commonly to ground GND.

The delay time of each delay circuit 102 is decided by the logic value of the capacitance control signal 112. More specifically, the N-type MOS transistors MN11–15 are each rendered conductive/non-conductive by the logic value of the capacitance control signal 112, thereby selecting the number of capacitors CAP11–15 connected to the internal node N1 and, hence, varying the delay time of the input signal IN1. In other words, the delay time of each delay circuit 102 shown in FIG. 2 is set by the capacitance control signal (not shown in FIG. 2).

The construction of the delay circuit 102 is obtained by combining into one the two inputs of a timing-difference dividing circuit (see FIG. 4) 121 used in a frequency multiplier circuit or the like, and the delay characteristic thereof is equivalent to that of a timing dividing circuit (interpolator) whose two inputs are timed to be simultaneous.

The operation of this embodiment will now be described.

Figure 5:
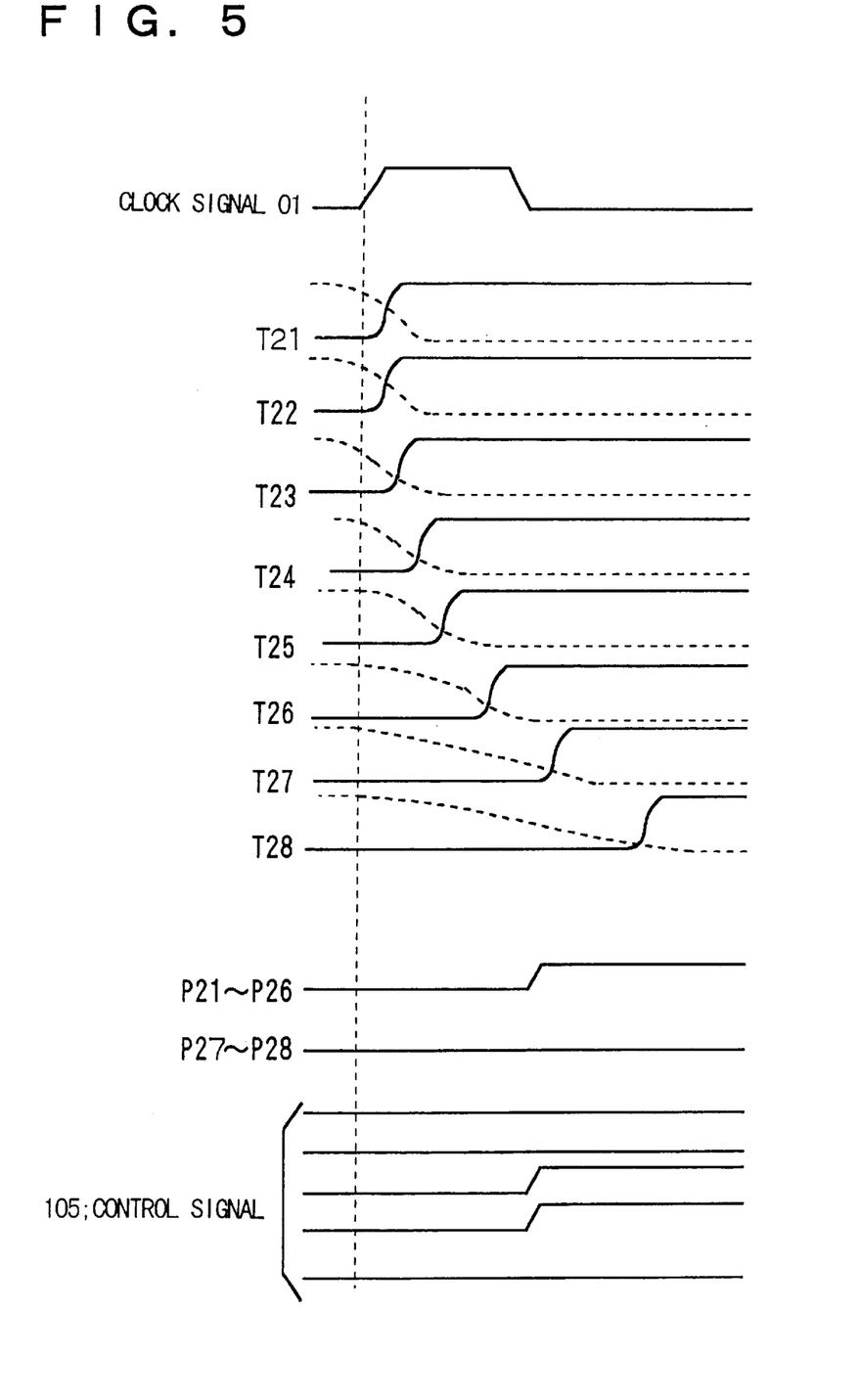
FIG. 5 is a diagram illustrating operation timing waveforms according to an embodiment.

FIG. 5 is a timing chart useful in describing the operation of this embodiment. The waveform indicated by the dashed line in each of the waveforms of outputs T21 to T28 of the respective delay circuits 102 indicates the potential waveform at the internal node N1 of the respective delay circuit 102. The delay time of the delay circuit 102 is decided by the preset capacitance value applied to the internal node N1. When the delay time arrives, the output changes to the high level via the inverter INV03.

The output of the delay circuit 102 is maintained for the period of time during which the high level of the clock signal 101 is applied thereto.

The circuit at the boundary between outputs from delay circuits whose outputs have changed over and outputs from delay circuits whose outputs have not changed over (i.e., whose outputs remain at the low level) is identified by the encoders 104, which output the control signal 105 so as to select a suitable circuit constant in a delay circuit, etc., of a subsequent stage. More specifically, as shown in FIG. 5, outputs P21–P26 of the latch circuits 103 all attain the high level and outputs P27–P28 of the latch circuits 103 remain at the low level when the clock signal 101 undergoes a transition from the high to the low level.

Each encoder circuit 104 receives the two outputs from two mutually adjacent latch circuits 103. If the values of these two outputs are different, the particular encoder specifies the boundary between the outputs of the delay circuits 102 and outputs the encoded control signal 105 (five bits in FIG. 2).

In the delay sensing circuit shown in FIG. 2, coarse adjustment of timing is carried out. Fine adjustment of the delay circuit is performed by variably setting the capacitance value based upon the control signal 105.

Figure 4:
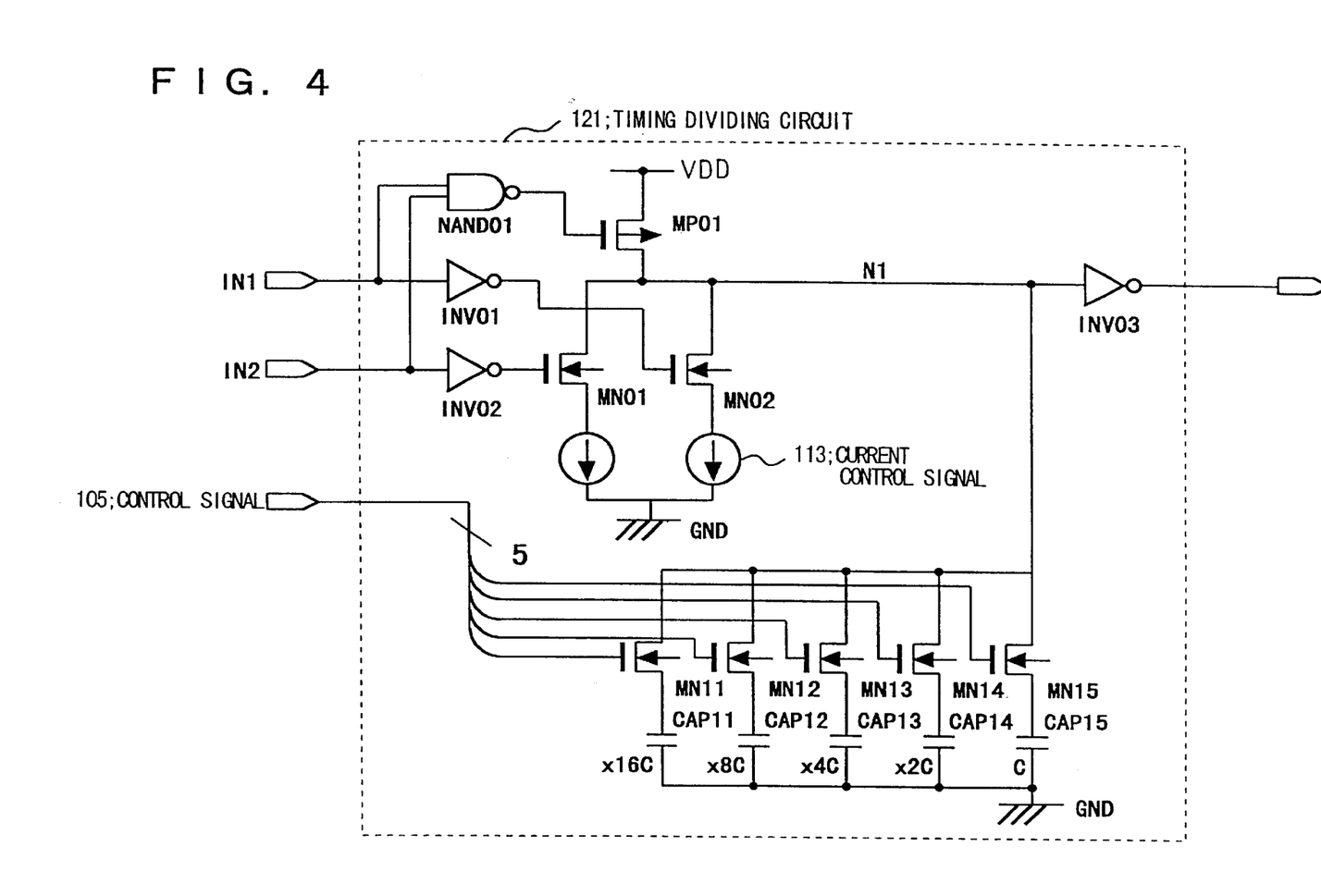
FIG. 4 is a diagram showing the construction of a timing dividing circuit (interpolator) according to an embodiment.

In a case, as one example, where two successive clock signals of a 4-phase clock enter the timing dividing circuit (interpolator: timing-difference dividing circuit) 121 shown in FIG. 4, there is selected a vicinity generally at the center of a range of capacitances in which it is possible to output accurately a timing that is one-half the difference between the timings of the two inputs. This is an example of a delay-circuit capacitance value selected by the control signal 105. It should be noted that the timing dividing circuit (interpolator) 121 shown in FIG. 4 has a construction basically the same as that of the delay circuit shown in FIG. 3. The same input signal IN enters in FIG. 3. In FIG. 4, on the other hand, signals obtained by inverting the inputs IN1 and IN2 by the inverters INV01 and INV02, respectively, are the gate inputs of the N-type MOS transistors MN02 and MN01, respectively, and the NAND output of the inputs IN1 and IN2 is the gate input to the P-type MOS transistor MP01.

By way of example, with regard to a multiphase (e.g., 4-phase) clock 203 produced by frequency-dividing the clock signal 101 by a frequency divider 202, as shown in FIG. 10 illustrating a clock frequency multiplier circuit, a vicinity generally at the center of a range of capacitances in which it is possible to output a timing that is one-half the difference between the timings of two inputs is selected as a control signal 207 from a clock period sensing circuit 206. In FIG. 10, the clock period sensing circuit 206 to which the clock signal 101 is input is constituted by the clock period sensing circuit of the present invention shown in FIG. 2. A clock frequency multiplier circuit 205 is constituted by timing-difference dividing units 204a. Clock signals obtained by multiplexing the outputs of the timing-difference dividing units 204a by multiplexer circuits 204b are combined by a clock combining circuit 208, whereby a frequency-multiplied clock 209b is obtained. (For example, see Japanese Patent Kokai Publication JP-A-11-4146.)

Thus, in this embodiment, there is provided a timing dividing circuit (interpolator) which, by receiving the control signal 105 indicative of the clock delay sensed by the circuit shown in FIG. 2, has its capacitance value varied so that the timing thereof can be finely adjusted.

Figure 6:
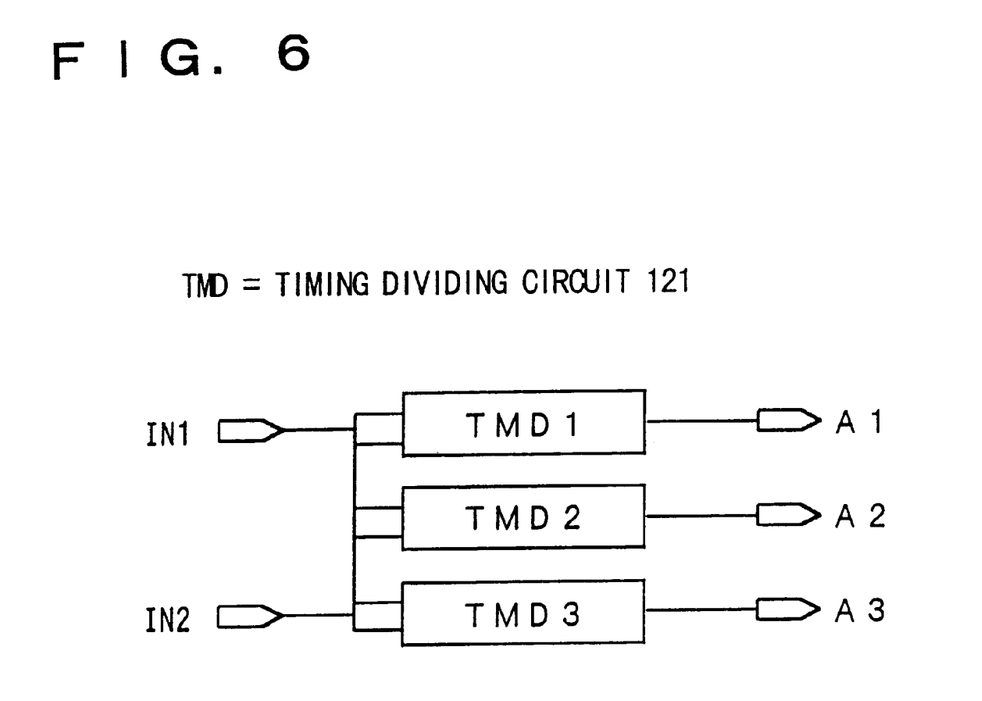
FIG. 6 is a diagram illustrating the manner in which timing is generated by the timing dividing circuit (interpolator) according to an embodiment.

FIG. 6 illustrates a circuit arrangement for extracting a timing which is one-half the difference between the input times of the two inputs IN1, IN2 using the timing dividing circuit (interpolator) 121. As shown in FIG. 6, the circuit comprises a timing dividing circuit (interpolator) TMD1 whose two inputs are connected to the first input IN1 and whose output is A1; a timing dividing circuit (interpolator) TMD2 one of whose two inputs is connected to the first input IN1, the other of whose two inputs is connected to the second input IN2 and whose output is A2; and a timing dividing circuit (interpolator) TMD3 both of whose two inputs are connected to the second input IN2 and whose output is A3.

Figure 7:
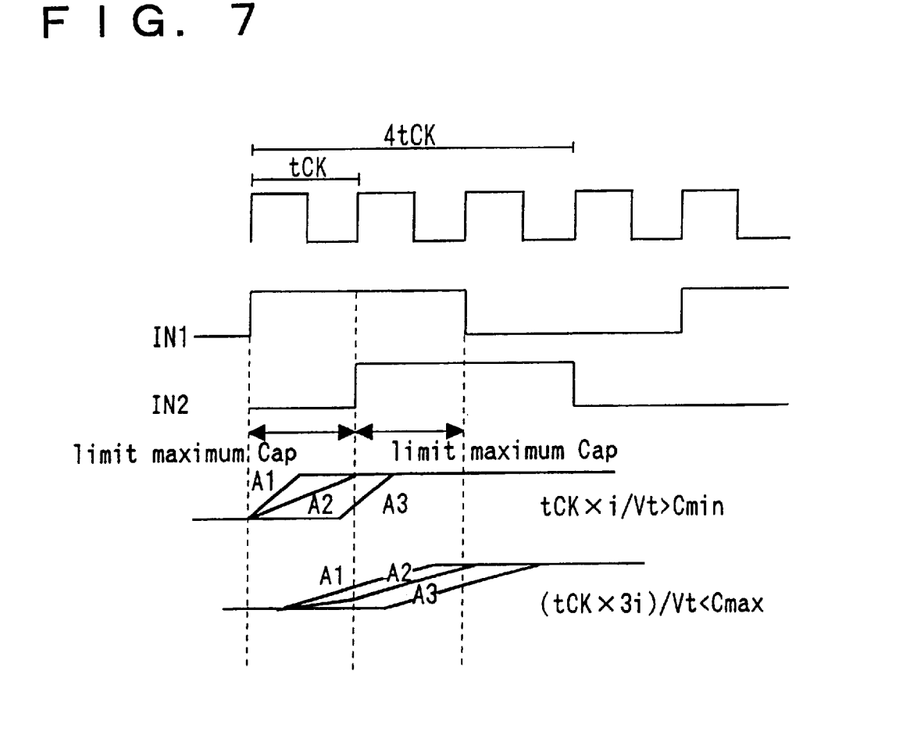
FIG. 7 is a diagram illustrating the manner in which timing is generated by the timing dividing circuit (interpolator) according to an embodiment.

As shown in FIG. 7, the difference between the timings of the outputs A1 and A3 is absolutely equal to the difference between the input times of the inputs IN1, IN2. The difference between the input times of A1 and A2 becomes exactly one-half of the difference between the input times of IN1 and IN2 if the output A2 is delivered from the end of the period during which only IN1 is high to the end of the period during which both IN1 and IN2 are high. This characteristic is decided by the capacitance value within the timing dividing circuit (interpolator) TMD2 (see CAP11–CAP14 in FIG. 4).

Figure 8:
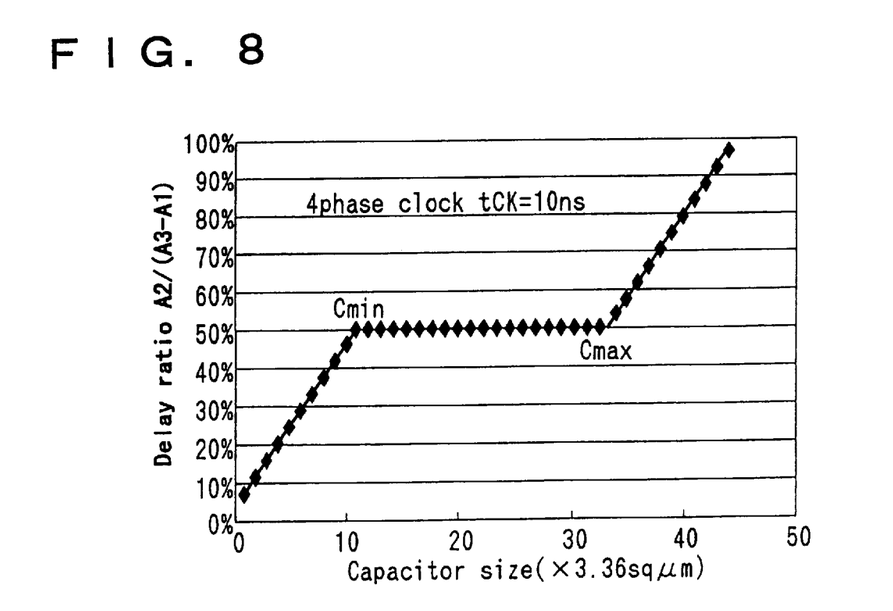
FIG. 8 is a diagram illustrating the relationship between the capacitance of a timing dividing circuit (interpolator) and delay ratio according to an embodiment.

FIG. 8 is a diagram showing the relationship between the capacitance of the timing dividing circuit (interpolator) and delay ratio [=A2/(A3−A1)]. As illustrated in FIG. 8, capacitance values for outputting a delay time which is exactly half (i.e., delay ratio=50%) range from a capacitance value Cmin, which is exactly that at which an output is obtained during the input time difference of IN1 and IN2 only in a period during which IN1 is at the high level, to a capacitance value that is three times this capacitance value (i.e., Cmax=3×Cmin).

Figure 9:
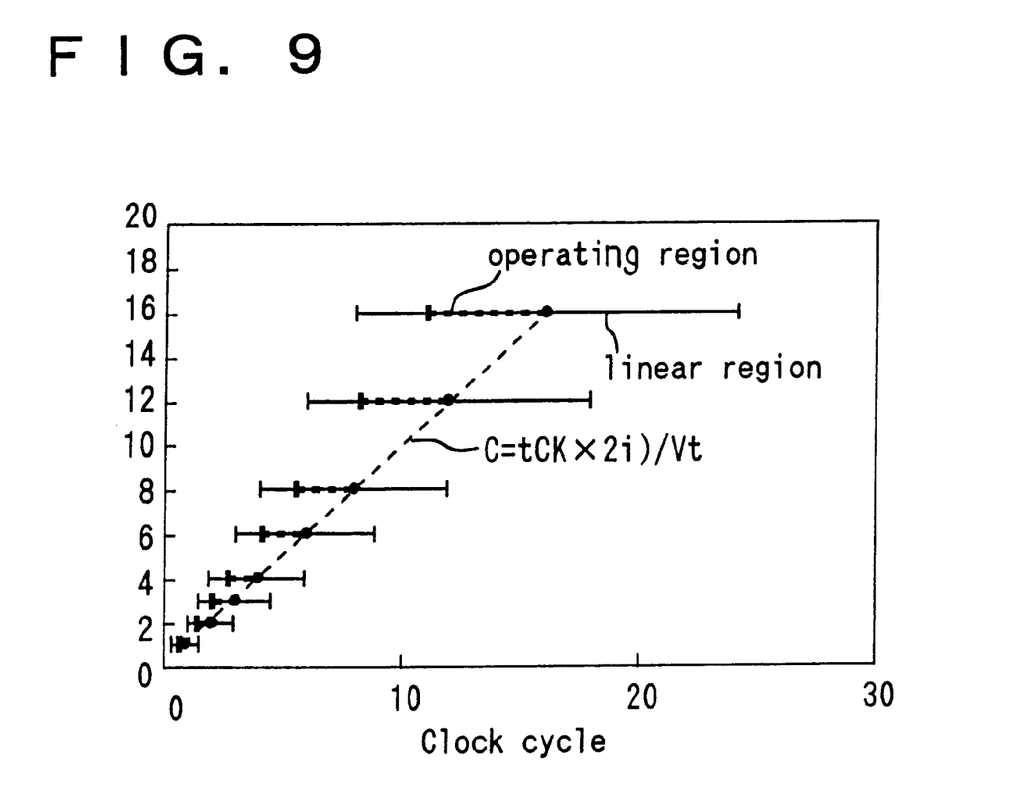
FIG. 9 is a diagram showing an operating region according to an embodiment.

In this embodiment, therefore, in order to sense the delay time in each delay circuit 102, as shown in FIG. 9, a value (capacitance C=tCK×2i/Vt, where Vt represents amplitude voltage, i the constant-current value and tCK the clock period) exactly in the middle of the above-mentioned range of capacitances is taken by selecting a capacitance value at which the output is inverted by two simultaneous inputs (IN1 in FIG. 3). In FIG. 9, the clock cycle is plotted along the horizontal axis and delay time along the vertical axis. As will be appreciated from FIG. 9, the capacitance value is set in such a manner that the operating regions of neighboring delay circuits overlap and the centers of operation thereof differ from one another.

Further, by making the delay times of the delay circuits 102 approximately 1.5 times X1, X1.5, X2, X4, X6, X8, X12 and X16, the characteristics for outputting a time which is one half the difference between the two inputs in the timing dividing circuit (interpolator) will overlap.

Thus, in accordance with the present invention as described above, it is possible to broaden the operating range of phase adjustment and frequency multiplier circuits, etc., by adopting an arrangement in which a coarse period adjustment is performed in advance.

More specifically, in accordance with the present invention, delay sensing circuits having slightly overlapping operating ranges are arranged in parallel, a clock signal is passed through the delay sensing circuits and clock period is sensed coarsely in short periods based upon a delay component between delay sensing circuits traversed by the clock signal and delay sensing circuits not traversed by the clock signal.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock frequency multiplier circuit for outputting a frequency-multiplied clock, comprising:

a frequency dividing circuit for frequency-dividing a clock signal, generating and outputting a multiphase clock;

a clock period sensing circuit to which the clock signal is input;

a plurality of timing dividing circuits (interpolators) for outputting timing signals obtaining by dividing differences between input timings of the multiphase clock; and multiplexer circuits for multiplexing outputs of said plurality of timing dividing circuits (interpolators);

wherein said clock period sensing circuit comprises:

a plurality of parallel connected delay sensing circuits having slightly overlapping operating ranges and different centers of operation, wherein said clock signal is passed through said plurality of delay sensing circuits, and a period of the clock signal is sensed and a control signal is outputted which identifies delay sensing circuits through which the clock signal has passed and delay sensing circuits through which the clock signal has not passed.

2. A clock frequency multiplier circuit for outputting a frequency-multiplied clock, comprising:

a frequency dividing circuit for frequency-dividing a clock signal, generating and outputting a multiphase clock;

a clock period sensing circuit to which the clock signal is input;

a plurality of timing dividing circuits (interpolators) for outputting timing signals obtaining by dividing differences between input timings of the multiphase clock; and multiplexer circuits for multiplexing outputs of said plurality of timing dividing circuits (interpolators);

wherein said clock period sensing circuit comprises:

a plurality of delay circuits to which a clock signal is applied as a common input and which are arranged in parallel and have delay times that differ from one another;

a plurality of latch circuits to which outputs of respective ones of said delay circuits are input for latching the clock signal as a latch timing signal; and a plurality of encoder circuits to which the outputs of said latch circuits are input for encoding information representing a boundary between delay circuits traversed by the clock signal and delay circuits not traversed by the clock signal, and outputting the encoded information as a control signal.

3. A clock frequency multiplier circuit for outputting a frequency-multiplied clock, comprising:

a frequency dividing circuit for frequency-dividing a clock signal, generating and outputting a multiphase clock;

a clock period sensing circuit to which the clock signal is input;

a plurality of timing dividing circuits (interpolators) for outputting timing signals obtaining by dividing differences between input timings of the multiphase clock; and multiplexer circuits for multiplexing outputs of said plurality of timing dividing circuits (interpolators);

wherein said clock period sensing circuit comprises:

a plurality of delay circuits to which a clock signal is applied as a common input and which are arranged in parallel and have delay times that differ from one another;

a plurality of latch circuits to which outputs of respective ones of said delay circuits are input for latching the clock signal as a latch timing signal; and a plurality of encoder circuits to which the outputs of said latch circuits are input for encoding information representing a boundary between delay circuits traversed by the clock signal and delay circuits not traversed by the clock signal, and outputting the encoded information as a control signal, wherein said plurality of delay circuits have operating ranges that overlap each other slightly and centers of operation that differ from one another.

4. A clock frequency multiplier circuit for outputting a frequency-multiplied clock, comprising:

a frequency dividing circuit for frequency-dividing a clock signal, generating and outputting a multiphase clock;

a clock period sensing circuit to which the clock signal is input;

a plurality of timing dividing circuits (interpolators) for outputting timing signals obtaining by dividing differences between input timings of the multiphase clock; and multiplexer circuits for multiplexing outputs of said plurality of timing dividing circuits (interpolators);

wherein said clock period sensing circuit comprises:

a plurality of delay circuits to which a clock signal is applied as a common input and which are arranged in parallel and have delay times that differ from one another;

a plurality of latch circuits to which outputs of respective ones of said delay circuits are input for latching the clock signal as a latch timing signal; and a plurality of encoder circuits to which the outputs of said latch circuits are input for encoding information representing a boundary between delay circuits traversed by the clock signal and delay circuits not traversed by the clock signal, and outputting the encoded information as a control signal, wherein each of said delay circuits has:

a P-type transistor which is connected between a power supply and an internal node and to which a signal obtained by inverting an input signal is applied as a gate input; and an N-type transistor, which is driven by a constant-current source, connected between said internal node and ground and to which the signal obtained by inverting the input signal is applied as a gate input;

a plurality of serially connected switches and capacitors being connected in parallel between said internal node and ground, and delay time being decided by deciding a capacitance applied to said internal node by a capacitance control signal connected to a control terminal of each switch;

said delay circuit having an inverter for inverting and outputting a potential present at said internal node.

5. The clock frequency multiplier circuit according to claim 1, wherein each of said timing dividing circuits (interpolators) has:

a P-type transistor which is connected between a power supply and an internal node and to which a signal obtained by taking NAND between first and second input signals is applied as a gate input; and first and second N-type transistors, which are driven by a constant-current source, connected between said internal node and ground and to which signals obtained by inverting the first and second input signals are applied as gate inputs;

a plurality of serially connected switches and capacitors being connected in parallel between said internal node and ground, and amount of delay being decided by deciding a capacitance applied to said internal node by a capacitance control signal connected to a control terminal of each switch;

each timing dividing circuit (interpolator) having an inverter for inverting and outputting a potential present at said internal node;

the capacitance being decided by a control signal from said clock period sensing circuit.

6. The clock frequency multiplier circuit according to claim 2, wherein each of said timing dividing circuits (interpolators) has:

a P-type transistor which is connected between a power supply and an internal node and to which a signal obtained by taking NAND between first and second input signals is applied as a gate input; and first and second N-type transistors, which are driven by a constant-current source, connected between said internal node and ground and to which signals obtained by inverting the first and second input signals are applied as gate inputs;

a plurality of serially connected switches and capacitors being connected in parallel between said internal node and ground, and amount of delay being decided by deciding a capacitance applied to said internal node by a capacitance control signal connected to a control terminal of each switch;

each timing dividing circuit (interpolator) having an inverter for inverting and outputting a potential present at said internal node;

the capacitance being decided by a control signal from said clock period sensing circuit.

* * * * *